United States Patent [19]
Herzog

[11] 3,944,949
[45] Mar. 16, 1976

[54] FREQUENCY MODULATOR

[75] Inventor: William Frederic Herzog, San Martin, Calif.

[73] Assignee: Ampex Corporation, Redwood City, Calif.

[22] Filed: Nov. 18, 1974

[21] Appl. No.: 524,656

[52] U.S. Cl. .................................. 332/14; 331/111
[51] Int. Cl.² .......................................... H03K 9/06
[58] Field of Search........ 332/30 R, 30 V, 14, 16 R, 332/16 T; 331/36 C, 177 V, 111, 143

[56] References Cited
UNITED STATES PATENTS

| | | | |
|---|---|---|---|
| 3,290,617 | 12/1966 | Bellem | 331/111 X |
| 3,328,724 | 6/1967 | Way | 332/14 X |
| 3,371,291 | 2/1968 | Forrest | 332/30 R |
| 3,528,036 | 9/1970 | Belkson | 332/30 V X |
| 3,581,239 | 5/1971 | Knutson | 332/30 X |
| 3,794,934 | 2/1974 | Rhee | 331/111 X |
| 3,842,371 | 10/1974 | Kelley | 331/143 |

Primary Examiner—John Kominski

[57] ABSTRACT

A frequency modulator includes a capacitor, a controlled current source, and a bistable circuit. The current source and bistable circuit operate to alternately vary the charge in opposite directions on the capacitor. The frequency of opposite charge variation is controlled by the amplitude of the input signal applied to the current source. A control circuit coupled to the capacitor and the bistable circuit varies the frequency of opposite charge variation to provide a linear frequency versus input signal amplitude.

9 Claims, 1 Drawing Figure

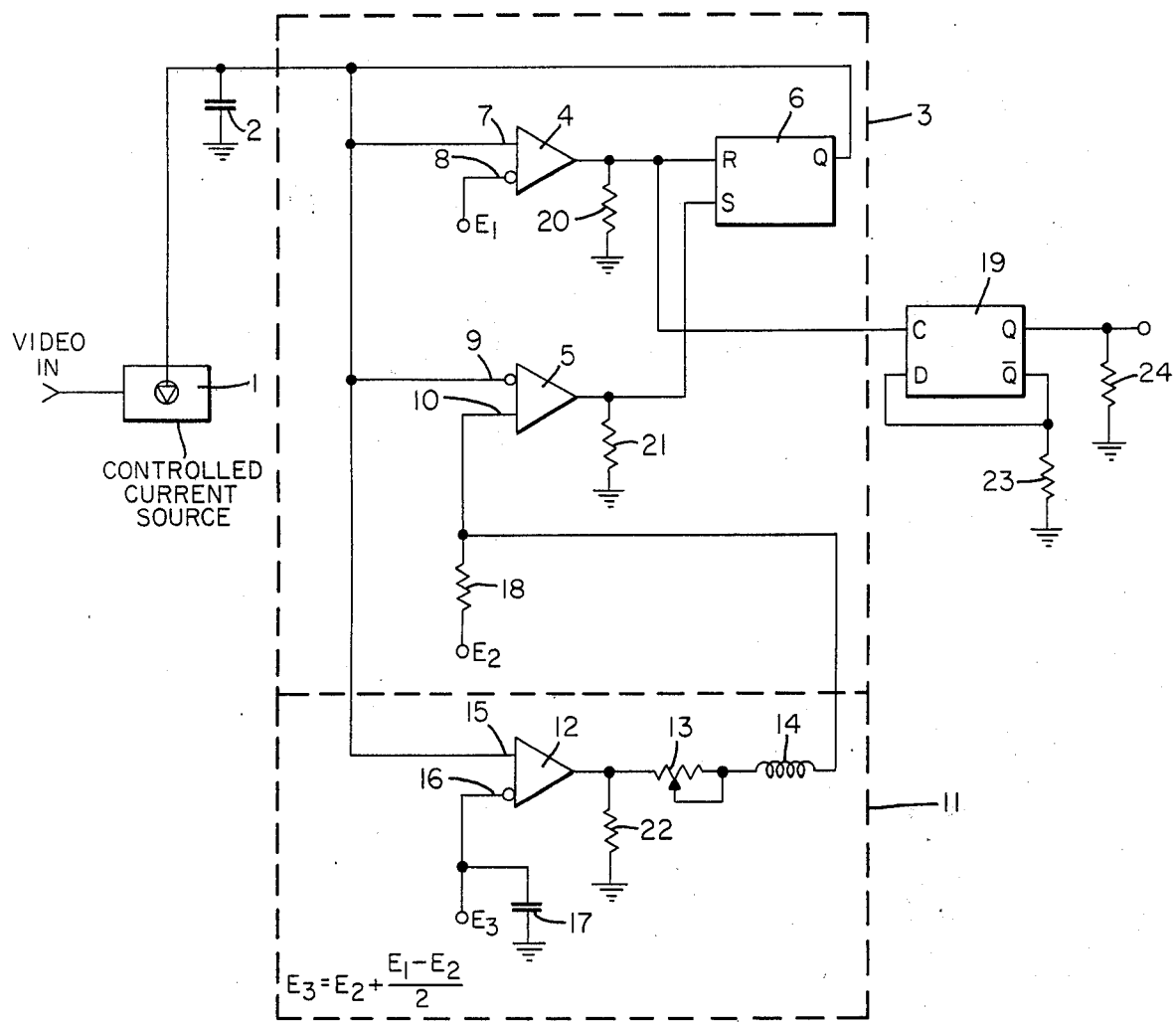

FREQUENCY MODULATOR

BACKGROUND OF THE INVENTION

In magnetic recording of television signals, present technological limitations on the recording process limit the frequency range of the recorded signal to 10 octaves. However, the video signal spectrum encompasses 17–18 octaves. Consequently, compression of the video signal bandwidth is necessary in order to record all the information contained within the signal. Frequency modulation is one method of compressing the bandwidth of a signal and pulse frequency modulation has been put to significant use in the professional video recording industry.

High quality is required in all television signal recording applications. Moreover, the broadcasting industry has developed rigid standards with respect to signal quality. Accordingly, the fm modulators utilized in video tape recorders must provide a minimum of signal distortion and a maximum of fidelity. Such modulators are complex in design and expensive to construct.

One such modulator iss utilized in the model AVR-1 video tape recorder manufactured by the Ampex Corporation. That modulator is a pulse modulator which utilizes a form of relaxation oscillator that incorporates a tunnel diode. The tunnel diode operates as a bistable device that is switched between its stable states to control capacitor charge and discharge cycles. The capacitor is charged and discharged by way of two separate current sources. A differential amplifier is also employed to control the exact points at which the oscillator changes states. The modulator is constructed of discrete elements utilizing specially ordered transistors and other high quality circuit elements. The tunnel diode itself is an expensive item. The circuit is complex and relatively expensive to construct.

The AVR-1 is a high quality pulse frequency modulator. However, even in the highest quality modulators a finite switching time is required for the oscillator and other circuit elements to change states. This switching time is a constant independent of operating frequency. At the high frequencies utilized in video tape recording, switching time constitutes a substantial part of the pulse width. Consequently, a nonlinear relationship between changes in the video signal and changes in modulated frequency can result. The signal will be distorted unless some compensation is provided to maintain a linear functional relationship.

SUMMARY OF THE INVENTION

Accordingly, the present invention constitutes a frequency modulator for use in a recorder that provides high quality, linear, distortion free modulation in a simple circuit design utilizing inexpensive, readily available electronic components. The modulator includes a capacitor connected to both a controlled current source and a bistable device. The bistable device switches between two stable states in response to the instantaneous charge on the capacitor. While the bistable device is in one of its stable states, the current source is connected to vary the charge on the capacitor in one direction in response to an incoming control signal. The bistable device varies the charge on the capacitor in the other direction while it is in the other of its stable states. Accordingly, the charge on the capacitor is varied alternately in either direction by the cooperative actions of the current source and the bistable device to create a free running signal modulated by the incoming control signal applied to the current source.

For applications requiring a linear frequency-to-control-signal relationship, the bistable device can advantageously be provided with a control terminal for varying one of the points at which it switches between its stable states. A control circuit is connected between the capacitor and the control terminal to apply a signal to the control terminal which varies with the frequency of the signal across the capacitor. Because the bistable device has finite switching times which constitute a significant portion of the time of one complete cycle, a linear relationship between the incoming signal level applied to the controlled current source and the switching frequency of the circuit would not attain unless the frequency changes were varied by the control circuit. In this fashion, a linear frequency to control signal relationship is obtained directly from the fm modulator.

DESCRIPTION OF THE DRAWING

The FIGURE is a schematic representation of the preferred embodiment of the instant frequency modulator.

DESCRIPTION OF THE PREFERRED EMBODIMENT

Referring to the figure, the preferred embodiment of the present invention is shown as arranged for use in television signal systems. The frequency modulator includes a controlled current source 1 connected to vary the charge on a capacitor 2 in a first direction. In the illustrated embodiment, source 1 is arranged to discharge capacitor 2. The video signal, which is to be frequency modulated onto a carrier, is coupled so that its amplitude controls the current level generated by the source 1. A bistable circuit 3 cooperates with the current source 1 and capacitor 2 to generate the desired frequency modulated signal. Preferably, the bistable circuit 3 comprises differential comparators 4, 5 and flipflop 6. A first input 7, 9 of each differential comparator is coupled to capacitor 2. The outputs of the differential comparators 4, 5 are coupled respectively to the reset and set triggers of flip-flop 6. The Q output of flip-flop 6, which is utilized in the circuit, is coupled to capacitor 2. When the Q output of flip-flop 6 is in the "high" state, having been triggered at the set terminal, capacitor 2 is rapidly charged to a high voltage level. A short, but significant period of time is required to charge the capacitor to this voltage level due to the finite switching time of flip-flop 6. For example, the charging time of capacitor 2 is 5 ns. which is a significant portion of the 30 ns. cycle time necessary for present broadcast recording standards.

The second inputs 8, 10 of comparators 4 and 5 respectively are coupled to reference voltages $E_1$ and $E_2$. $E_1$ and $E_2$ determine the points at which comparators 4 and 5 respectively will send reset and set impulses to flip-flop 6, thereby determining the trigger points of the two stable states of the bistable circuit 3. In the preferred embodiment input 10 of comparator 5 constitutes a control terminal for the bistable circuit as will hereinafter be described.

A control circuit 11 which preferably comprises differential comparator 12, adjustable resistor 13 and inductor 14 is coupled in series between capacitor 2 and control terminal 10. Input 15 of comparator 12 is coupled to the capacitor 2. Input 16 is coupled to a voltage source $E_3$ having a value midway between $E_1$ and $E_2$ for a purpose to be explained hereafter, $E_1$ being larger than $E_2$ in the illustrated embodiment. A resistor 18 is coupled between source $E_2$ and terminal 10 to provide some isolation between source $E_2$ and the control circuit. The control circuit in the illustrated embodiment provides a means of compensating for nonlinear variations in modulated frequency due to the finite switching time of the bistable circuit.

The output of comparator 4 is also connected to trigger flip-flop 19 which provides the final output of the circuit. In one construction of the embodiment shown, the comparators 4, 5 and 12 are all part of one integrated circuit chip and flip-flops 6 and 19 are part of another chip of the MECL 10,000 series manufactured by Motorola Semiconductor Products Inc. Pull down resistors 20 to 24 are connected to the terminals of the chips as shown to assure that the circuits remain forward biased. No pull down resistor has been used with flip-flop 6 since it must change states completely to avoid applying a charge to capacitor 2 during the discharge portion of the cycle which would result in nonlinear discharging of the capacitor.

In operation, the circuit of the preferred embodiment first provides a charge on capacitor 2, the Q output of the flip-flop 6 being in the "high" state, until the value of $E_1$ is reached, at which time the comparator 4 sends a reset signal to flip-flop 6, turning the Q output "low." Capacitor 2 then discharges at a rate determined by the flow in current source 1 as determined by the amplitude of the video signal input until the voltage value at control terminal 10 is reached. This causes comparator 5 to send a set signal to flip-flop 6, turning its Q output "high" so that the cycle repeats itself. Terminal 8 of comparator 4 is a reversing terminal as is terminal 9 of comparator 5. Consequently a "high" output is provided by comparator 4 when the voltage at terminal 7 is higher than the voltage at terminal 8 and a "high" is provided by comparator 5 when the voltage at terminal 9 is lower than that at terminal 10.

The time necessary for capacitor 2 to charge up, which is dependent on the switching time of the bistable circuit, is fixed. The time for capacitor 2 to discharge depends on the current generated by current source 1, which is determined by the magnitude of the video signal input. It is readily apparent, then, that as the video signal varies, the discharge time of capacitor 2 varies to change the frequency of the modulator and generate an fm signal.

Since, however, only the discharge portion of the cycle is varied, the frequency response of the modulator to video signal input will be non-linear. Control circuit 11 provides a linear response by changing state at a voltage point midway between the voltage levels at which the comparators 4 and 5 change state as determined by source $E_3$. The square wave output from comparator 12 is filtered by RL filter 13, 14, applied to control terminal 10 and added to voltage $E_2$. As the frequency of the oscillator increases, the total voltage at control terminal 10 increases to cause comparator 5 to switch in a shorter time during the discharge portion of the cycle. The discharge time is shortened to compensate for the finite fixed charging time of capacitor 2 and provide a compensated linear frequency to input voltage output. The precise switching point is adjusted by varying resistor 13 to provide optimum compensation.

The signal at the output of comparator 4 is halved by flip-flop 19 to provide the final pulse fm signal.

The frequency modulator of the preferred embodiment provides a linear, high quality output without the use of expensive components such as tunnel diodes. Rather, readily available, off-the-shelf components are used with no loss of quality over the prior art circuits.

What we claim is:

1. A frequency modulator comprising;
 a capacitor;
 a controlled current source coupled to said capacitor and responsive to an applied modulating signal for varying the charge on it in a first direction at a rate dependent upon said applied modulating signal;
 a bistable circuit coupled to said capacitor and responsive to the charge thereon to be switched to each of its two stable states, said current source being coupled to vary the charge on said capacitor in a first direction when said bistable circuit is in a first of its two stable states, said bistable circuit coupled to vary the charge on said capacitor in a second direction opposite said direction when in a second of its two stable states, said bistable circuit having a control terminal for controlling the frequency of switching between its stable states; and,
 a control means coupled between said capacitor and said control terminal for controlling the stable state switching frequency dependent on the rate of charge variation provided by said current source.

2. The frequency modulator of claim 1 wherein:
 said bistable circuit comprises first and second differential comparators and a flip-flop having a reset terminal coupled to an output of said first comparator and a set terminal coupled to an output of said second comparator, an input of each said comparator and one output of said flip-flop being coupled to said capacitor, said first comparator responsive to the charge on said capacitor attaining a first level to reset said flip-flop to the first state of the bistable circuit, said second comparator responsive to the charge on said capacitor attaining a second level to set said flip-flop to the second state of the bistable circuit, and said second comparator having an additional input comprising said control terminal.

3. The frequency modulator of claim 2 wherein:
 said control means comprises a third differential comparator having an input coupled to said capacitor and an output coupled to said control terminal, said third comparator responsive to the charge on said capacitor attaining a third level between said first and second levels to adjust a control signal coupled to said control terminal.

4. The frequency modulator of claim 3 wherein:
 a filter circuit is coupled between the output of said third differential comparator and said control terminal.

5. The frequency modulator of claim 4 wherein:
 said filter circuit comprises a series RL circuit including an adjustable resistor.

6. The frequency modulator of claim 1 wherein:
 said bistable circuit is coupled to vary the charge on said capacitor at a constant rate independent of changes in the applied modulating signal; and,
 said control means includes means for compensatingly changing the duration of the first stable state of the bistable circuit to provide linear changes in modulated frequency corresponding to changes in the applied modulating signal.

7. The frequency modulator of claim 6 wherein:
said compensating means comprises a differential comparator having an input coupled to said capacitor and an adjustable filter circuit coupled between the output of said differential comparator and said control terminal, said comparator being responsive to the charge on said capacitor attaining a level to adjust a control signal coupled to said control terminal.

8. The frequency modulator of claim 1 wherein:
said bistable circuit comprises first and second differential comparators and a flip-flop having a reset terminal coupled to an output of said first comparator and a set terminal coupled to an output of said second comparator, each of said comparators having first and second inputs, the first input of each said comparator and one output of said flip-flop coupled to said capacitor, the second input of said first comparator coupled to a first reference voltage, the second input of said second comparator coupled to a second different reference voltage, said first comparator responsive to the charge on said capacitor attaining a first level corresponding to said first reference voltage to reset said flip-flop to the first state of the bistable circuit, said second comparator responsive to the charge on said capacitor attaining a second level corresponding to said second reference voltage to set said flip-flop to the second state of the bistable circuit, said second input of said second comparator comprising said control terminal.

9. The frequency modulator of claim 8 wherein:
said control means comprises a third differential comparator and a filter circuit for varying the amplitude of the output provided by said third comparator with frequency, said third comparator having first and second inputs and an output, the first input of said third comparator coupled to said capacitor, the second input of said third comparator coupled to a third reference voltage between said first and second reference voltages, said filter circuit coupled between the output of said third comparator and the second input of the second comparator, said third comparator responsive to the charge on said capacitor attaining a level corresponding to said third reference voltage to change states at its output.

* * * * *